(12) United States Patent
Juan et al.

(10) Patent No.: US 7,270,939 B2
(45) Date of Patent: Sep. 18, 2007

(54) PHOTORESIST COMPOSITION FOR LCD LIGHT DIFFUSE REFLECTING FILM

(75) Inventors: Chun-Wei Juan, Jhongli (TW); Shao-Yun Liu, Jhongli (TW)

(73) Assignee: Everlight USA, Inc., Pineville, NC (US)

( * ) Notice: Subject to any disclaimer, the term of this patent is extended or adjusted under 35 U.S.C. 154(b) by 128 days.

(21) Appl. No.: 11/091,580

(22) Filed: Mar. 29, 2005

(65) Prior Publication Data
US 2005/0260523 A1    Nov. 24, 2005

(30) Foreign Application Priority Data
May 21, 2004   (CN)   .................. 2004100453440

(51) Int. Cl.
*G03F 7/028*   (2006.01)
(52) U.S. Cl. .............................. 430/285.1; 430/284.1; 430/281.1
(58) Field of Classification Search .................... None
See application file for complete search history.

(56) References Cited
U.S. PATENT DOCUMENTS

| | | | | |
|---|---|---|---|---|
| 4,082,883 A | * | 4/1978 | Malpass et al. | 442/187 |
| 5,008,302 A | * | 4/1991 | Husler et al. | 522/14 |
| 5,462,700 A | * | 10/1995 | Beeson et al. | 264/1.27 |
| 5,767,169 A | * | 6/1998 | Leppard et al. | 430/281.1 |
| 6,265,133 B1 | * | 7/2001 | Takahashi et al. | 430/281.1 |

OTHER PUBLICATIONS

RN 1328-53-6, Registry ACS on STN, C.I. Pigment Green 7, entered STN: Nov. 16, 1984, 2 pages.*
AN 1971:77152, Caplus, ACS on STN, entered in STN May 12, 1984, 1 page English abstract of JP 45027902 B4 published Sep. 11, 1970.*
RN 3846-71-7, Caplus, REgistry ACS on STN, Phenol, 2-(2H-benzotriazol-2-yl)-4,6-bis(1,1-dimethylethyl)- (9CI) (CA □□Index Name), entered STN: Nov. 16, 1984.*

* cited by examiner

*Primary Examiner*—Cynthia Hamilton
(74) *Attorney, Agent, or Firm*—Bacon & Thomas, PLLC

(57) ABSTRACT

A photoresist composition for LCD light diffuse reflecting film is disclosed, which comprises (a) 8 to 90% by weight of base-soluble resin; (b) 1 to 30% by weight of polyfunctional unit; (c) 0.1 to 20% by weight of photopolymerization initiator; (d) 0.1 to 20% by weight of thermosetting cross-linking reagent; (e) 0.01 to 10% by weight of ultraviolet absorber; and (f) 8 to 90% by weight of solvent.

11 Claims, No Drawings

PHOTORESIST COMPOSITION FOR LCD LIGHT DIFFUSE REFLECTING FILM

BACKGROUND OF THE INVENTION

1. Field of the Invention

The present invention relates to a negative photoresist composition and, more particular, to a photoresist composition of the LCD light diffuse reflecting film.

2. Description of the Related Prior Art

Presently, the conventional photosensitive photoresist for the light diffuse reflecting film can be generalized into two types, dry film photoresist and liquid film photoresist. Because air bubbles have the tendency of being trapped between the dry film photoresist and the glass material upon being laminated together, yet the pattern of the light diffuse reflecting film is solely determined by the supplier, therefore dry film photoresist is not applicable to users with a specific design thus not highly recognized in the market.

On the other hand, the liquid film photoresist can be further categorized into two types, positive photoresist and negative photoresist. The primary advantage of the positive photoresist is that the desirable form of the photoresist is controllable, however it has disadvantages such as low transmission from its pale yellowish color, and poor chemical resistance. As for the negative photoresist, both chemical resistance and transmission are superior, but its weakness are such that the resolution is poor and the desired form of photoresist cannot be established as wish.

To develop a new kind of negative photoresist composition from which the foregoing disadvantages are absent, the present invention introduces an ultraviolet absorber. The addition of an ultraviolet absorber improves and effectively controls the degree of exposure when the present LCD is exposed during the manufacturing process, thereby allowing the unexposed area with high resolution region to effectively develop and obtain the desire pattern on the light diffuse reflecting film.

SUMMARY OF THE INVENTION

The present invention provides a negative photoresist composition for the manufacturing of the LCD light diffuse reflecting film. The photoresist has excellent photo-sensitivity, and yields well-resolved images and patterns after being developed.

The photoresist composition of the present invention as well consists of qualities such as superb heat resistance, solvent resistance, better substrate adhesion, and outstanding controllability on curved surfaces; also, reflective or translucent photoresist composition of the LCD light diffuse reflecting film can easily be formed for the LCD light diffuse reflecting film.

The negative photoresist composition of the present invention is prepared by adding a predetermined amount of ultraviolet absorber to the prescription of the photoresist composition. More particularly, by adjusting with the type and the amount of ultraviolet absorber added, the extent of exposure of the photoresist can be controlled, which reduces diffraction, scattering, and other physical phenomenon after exposing through a photo mask during the lithographic process. In returns, the originally unexposed region will overly experiences crosslinking upon light exposure, and achieving the desired curved lithographic pattern.

DETAILED DESCRIPTION OF THE PREFERRED EMBODIMENT

A negative photoresist composition for LCD light diffuse reflecting film of the present invention comprising (a) 8 to 90 weight percent of alkali-soluble resin; (b) 1 to 30 weight percent of polyfunctional unit; (c) 0.1 to 20 weight percent of photopolymerization initiator; (d) 0.1 to 20 weight percent of thermosetting crosslinking reagent; (e) 0.01 to 10 weight percent of ultraviolet absorber; and (f) 8 to 90 weight percent of solvent.

Listed below are the detailed descriptions of the composition of the respective components of the present invention:

(a) Alkali-Soluble Resin

As to the alkali-soluble resin of the present invention, it is not critical as long as the selected alkali-soluble resin is soluble in a base (alkali) developer solution. However, polymers consisting of carboxyl group, for example ethylenically unsaturated monomers which have at least one carboxyl group (below, known as "unsaturated monomer containing carboxyl group") or copolymers (below, known as "copolymer containing carboxyl group") such as ethylenically unsaturated monomers (below, known as "copolymerizable unsaturated monomers") are more preferable.

Examples of the above ethylenically unsaturated monomers having a carboxyl group include mono-carboxylic acids such as acrylic acid, methacrylic acid, crotonic acid, α-chloroacrylic acid, cinammic acid, ethacrylic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having 3 or more carboxyl groups, and mono(methacryloyloxyethyl)esters of unsaturated polycarboxylic acids having 2 or more carboxyl groups such as mono(2-acryloyloxyethyl) succinate, mono(2-methacryloyloxyethyl) succinate, mono (2-acryloyloxyethyl) phthalate, mono(2-methacryloyloxyethyl) phthalate; polymers of mono(meth)acrylates having terminal carboxyl group(s) and hydroxyl group(s) such as ω-carboxy-polycaprolactone monoacrylate and ω-carboxy-polycaprolactone monomethacrylate. These unsaturated carboxyl monomers can be used alone, or combined with one another or more.

Examples of the forgoing copolymerizable unsaturated monomers include aromatic vinyl compounds such as styrene, α-methylstyrene, o-vinyltoluene, m-vinyltoluene, p-vinyltoluene, p-chlorostyrene, o-methoxystyrene, m-methoxystyrene, p-methoxystyrene, indene, o-vinylbenzyl methyl ether, m-vinylbenzyl methyl ether, p-vinylbenzyl methyl ether and o-vinylbenzyl glycidyl ether, m-vinylbenzyl glycidyl ether and p-vinylbenzyl glycidyl ether; indenes (derivatives) such as indene and 1-methylindene; unsaturated carboxylic acid esters such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, 2-methoxyethyl acrylate, 2-methoxyethyl methacrylate, methoxydiethylene glycol acrylate, methoxydiethylene glycol methacrylate, methoxytriethylene glycol acrylate, methoxytriethylene glycol methacrylate, glycerol monoacrylate and glycerol monomethacrylate; unsaturated carboxylic acid aminoalkyl esters such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate and 3-aminopropyl methacrylate, 3-dimethylaminopropyl acrylate, 3-dimethylaminopropyl methacrylate; unsaturated carboxylic acid glycidyl esters such as glycidyl acrylate and glycidyl methacrylate; carboxylic acid vinyl esters such as vinyl acetate, vinyl propionate, vinyl butyrate and vinyl benzoate; unsaturated ethers such as vinyl methyl ether, vinyl ethyl ether, allyl glycidyl ether; vinyl cyanide compounds such as acrylonitrile, methacrylonitrile, α-chloroacrylonitrile and vinylidene cyanide; unsaturated imides such as acrylamide, methacrylamide, α-chloroacrylamide, N-2-hydroxyethyl acrylamide and N-2-hydroxyethyl methacrylamide; unsaturated imides such as maleimide, N-phenyl maleimide and N-cyclohexyl maleimide; and aliphatic conjugated dienes such as 1,3-butadiene, isoprene and chloroprene.

Monomers of polymer chain with terminal monoacryloyl or monomethacryloyl group such as polystyrene, polymethacrylate, polymethyl methacrylate, poly-n-butyl acrylate, poly-n-butyl methacrylate, or polysiloxane.

These copolymerizable unsaturated monomers can be used alone, or combined with one another or more.

The carboxyl copolymers of the present invention is preferably a copolymer of:

(1) an unsaturated monomer having at least one carboxyl group such as, acrylic acid and/or methacrylic acid, mono(2-acryloyloxyethyl)succinate and/or mono(2-methacryloyloxyethyl)succinate); and (2) at least one copolymer (below, known as "carboxyl group-containing copolymer") selected from the group consisting of styrene, methyl acrylate, methyl methacrylate, 2-hydroxyethyl acrylate, 2-hydroxyethyl methacrylate, allyl acrylate, allyl methacrylate, benzyl acrylate, benzyl methacrylate, N-phenylmaleimide, styrene, and methyl methacrylate.

Examples of carboxyl group-containing copolymers are showing as below: a copolymer of (meth)acrylic acid/methyl (meth)acrylate, a copolymer of (meth)acrylic acid/benzyl (meth)acrylate, a copolymer of (meth)acrylic acid/2-hydroxyethyl (meth)acrylate/benzyl (meth)acrylate, a copolymer of (meth)acrylic acid/methyl (meth)acrylate/styrene, a copolymer of (meth)acrylic acid/methyl (meth)acrylate/methyl methacrylate, a copolymer of (meth)acrylic acid/benzyl (meth)acrylate/styrene, a copolymer of (meth)acrylic acid/benzyl (meth)acrylate/methyl (meth)acrylate, a copolymer of (meth)acrylic acid/2-hydroxyethyl (meth)acrylate/benzyl (meth)acrylate/styrene, a copolymer of (meth)acrylic acid/2-hydroxyethyl (meth)acrylate/benzyl (meth)acrylate/methyl methacrylate, a copolymer of methacrylic acid/styrene/benzyl (meth)acrylate/N-phenylmaleimide, a copolymer of (meth)acrylic acid/mono(2-acryloyloxyethyl)succinate/styrene/benzyl(meth)acrylate/N-phenylmaleimide, a copolymer of (meth)acrylic acid/mono(2-acryloyloxyethyl)succinate/styrene/allyl (meth)acrylate/N-phenylmaleimide.

The preferred copolymer ratio of carboxyl group-containing unsaturated monomer in copolymer is in an amount of preferably 5 to 50 wt %, more preferably 10 to 40 wt %. When the ratio is less than 5 wt %, the solubility in an alkali developer of the obtained radiation sensitive composition may be lower, and when the ratio is in an amount of more than 50 wt %, the formed pixels may fall off from the substrate or the surfaces of the pixels may be roughened during development with an alkali developer.

Alkali-soluble resin of the present invention utilizes solvent of gel permeation chromatograph (GPC): tetrahydrofuran (THF) to determine the converted polystyrene mean molecular weight (below, recognized as Mw) usually between 3,000 to 300,000, preferably in the range of 3,000 to 100,000.

With the use of this alkali soluble resin with specific Mw, a finely developed photoresist is obtainable; as a result specific shapes can also be obtained.

Alkali-soluble resin of the present invention can be used alone, or combined with one another or more.

The amount of alkali-soluble resin used in the present invention is normally between 8~90 parts per 100 parts, preferably 20~70 parts per 100 parts by weight.

(b) Polyfunctional Monomers

The polyfunctional monomer in the present invention is a monomer having two or more polymerizable unsaturate bonds.

Examples of the polyfunctional monomers include diacrylates and dimethacrylates of alkylene diols such as ethylene glycol and propylene glycol;

diacrylates and dimethacrylates of polyalkylene diols such as polyethylene glycol and polypropylene glycol;

polyacrylates and polymethacrylates of polyhydric alcohols having 3 or more hydroxyl groups such as glycerin, trimethylolpropane, pentaerythritol and dipentaerythritol, and dicarboxylic acid modified products thereof;

oligoacrylates and oligomethacrylates such as polyesters, epoxy resins, urethane resins, alkyd resins, silicone resins and spiran resins;

diacrylates and dimethacrylates of both terminal hydroxylated polymers such as poly-1,3-butadiene, polyisoprene and polycaprolactone having a hydroxyl group at both terminals; and tris(2-acryloyloxyethyl) phosphate and tris(2-methacryloyloxyethyl)phosphate.

Out of these polyfunctional monomers, preferred are polyacrylates and polymethacrylates of polyhydric alcohols, as well as dicarboxylic acid modified products thereof, such as trimethylolpropane trimethacrylate, trimethylolpropane triacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexamethacrylate, and dipentaerythritol hexaacrylate, or one or more compound as described above, or one or more commercial products such as Aronix M-305, Aronix M-309, Aronix M-400, Aronix M-401, Aronix M-402, Aronix M-450481 (all from Toagosei Co., Ltd.,), preferably the compound represented by the following formula (1).

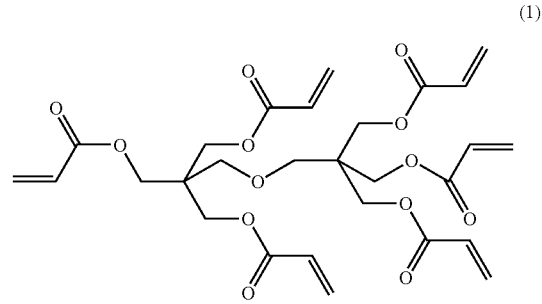

(1)

The aforementioned polyfunctional unit can be used alone, or combined with one another or more.

The amount by weight of polyfunctional unit of the present invention used with respect to (a) 100 parts of base-soluble resin, is usually 5~500 parts, preferably 20~300 parts. In general, once lower than 5 parts, the strength and the leveling of the surface after shaping will tend to decrease; on the other hand, if exceeding 500 parts, the trend of alkalinity decreases.

Moreover, depending on the condition of the present invention today, a fraction of the aforementioned polyfunctional unit may be replaced with the unifunctional monomer.

(c) Photopolymerization Initiator

As to the photopolymerization initiator of the present invention, visible, ultraviolet, and deep ultraviolet lights can be used to activate the initiator, consequently polymerization reaction of the aforesaid (b) polyfunctional unit can be carried and further undergo crosslinking; wherein a photosensitive compound sensitive to wavelength in the range of 190 to 450 nm is preferred; with only a slight exposure from an energy source may sufficiently crosslink the composition of the present invention.

Wherein (c) photopolymerization initiator comprising: morpholino, thioxanthone, imidazole and combinations of the functional groups, where one or/and more can be selected.

Examples of the commercial products of this group are: IRGACURE 184, IRGACURE 369, IRGACURE 907, IRGACURE OXE01, CGI 124, CGI 242 (the above listed are products of Ciba Specialty Chemicals) or Chemcure-709, Chemcure-ITX, Chemcure-481 (the above listed are product names of Chembridge International Corp) and others. Wherein, most preferable one is IRGACURE 907 or Chemcure-709 of compound formula (2).

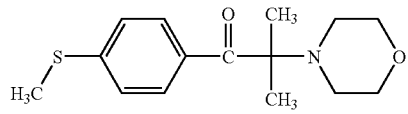

(2)

The aforementioned polypolymerization initiator of the present invention can be used alone, or combined with one another or more, or used together with other polypolymerization initiators.

The amount by weight of (c) photopolymerization initiator of the present invention used in with respect to (b) 100 parts of polyfunctional unit, is usually 0.1~200 parts, preferably 10~150 parts and more preferably 20~120 parts. At this point, if the total amount of light free radical initiator used is less than 0.1 parts, the hardening resulted from the exposure will not be sufficient, which may contribute to undesirable pattern; on the other hand, if exceeding 200 parts, the pattern obtained upon development may peel right off from the substrate.

In the present invention, at least one of a sensitizer, a curing accelerator and a polymer photocrosslinking/sensitizing agent may be optionally further used as required in conjunction with the above photopolymerization initiators.

(d) Thermosetting Crosslinking Reagent

For the purpose of enhancing the chemical resistance and mechanical strength of the shaped photoresist, a predetermined amount of thermosetting crosslinking reagent is introduced to the composition of the present invention in accordance with the hard baking preceded by exposing and developing of the photoresist film (generally a hard baking temperature of approximately 150° C.~280° C. is used to fix the shape, and oven time is set approximately for 5~120 minutes), to improve the degree of crosslinking of the photoresist film.

Examples of the thermosetting crosslinking reagents are hexamethylmelamine, hexabutylmelamine, partially methylized melamine and the alkylated products therof.

Compounds of the above commercial products are: Cymel 300, Cymel 301, Cymel 303, Cymel 323, Cymel 325, Cymel 327 (the products stated above are produced by Cytec Industries Inc.), Nikalac MW-30HM, Nikalac MW-100LM, Nikalac MX-750LM (the products stated above are produced by Sanwa Chemical Co.) and others. Wherein the most preferable is Cymel 303 of the compound (3) showing as below.

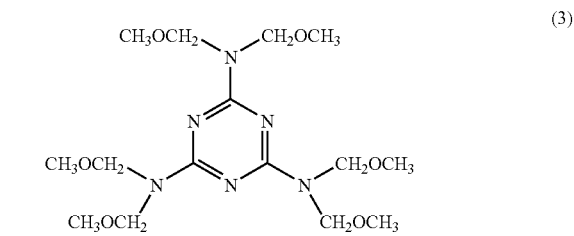

(3)

The amount by weight of (d) thermosetting crosslinking reagent of the present invention used in with respect to (a) 100 parts of base-soluble resin, is usually 1~100 parts, preferably 10~40 parts. The amount applied at the above region can achieve fine bumpy surfaces, while enhances the chemical resistance and the mechanical strength of the shaped photoresist film.

(e) Ultraviolet Absorber

Generally, the stepper or projector used in the manufacturing of LCD is affected by the sensitiveness of the photoresist, also by both the light scattering and the light diffraction of exposure through a photo mask. As a result, the resolution of the line width of a negative type photoresist is limited to 8~10 μm. Desiring a better resolution may create unexpected crosslinking in the unexposed region due to the optic factors and the sensitivity of the photoresist itself. Hence, the present invention is attempted under the same conditions where exposing instruments and photo mask remains unchanged throughout. Additionally, the attempt of adding ultraviolet absorber to the photoresist composition allows the characteristic of the photoresist composition to be controlled thereby obtaining a desired pattern.

The ultraviolet absorber of the present invention comprising a highly sensitive compound with high ultraviolet absorbance, particularly a compound sensitive to the wavelength of a light source between 190 to 450 nm.

(e) The ultraviolet absorber is selected from at least one of the benzotriazole ultraviolet absorbers, or the benzophenone ultraviolet absorbers or combinations thereof.

Compounds of the above commercial products are: Eversorb 10, Eversorb 11, Eversorb 12, Eversorb 234, Eversorb 71, Eversorb 72, Eversorb 73, Eversorb 74, Eversorb 75, Eversorb 76, Eversorb 77, Eversorb 78, Eversorb 79 and others (the products listed above are products of Everlight Chemical Inc.) or TINUVIN 326, TINUVIN 327, TINUVIN 328, TINUVIN 384, and TINUVIN 384-2 (the products listed above are products of Ciba Specialty Chemicals).

Wherein the most preferable one is Eversorb 77 of compound formula (4)

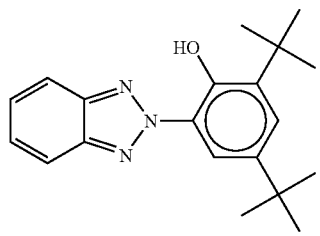

(4)

The aforementioned ultraviolet absorber of the present invention can be used alone, or combined with one another or more, or used together with other ultraviolet absorbers.

The amount of (e) ultraviolet absorber of the present invention used is preferably 0.1 to 5 weight percent.

(f) Solvent

The aforesaid components (a) through (e) are the primary substances for the making of the photoresist composition of the present invention. If necessary, the composition of the present invention may contain other additives. Generally, solvent is applied to form a liquid composition.

Any solvent is acceptable to the solvent in the present invention as far as it disperses or dissolves the above components (a) to (e), and does not react with these components and has suitable volatility.

Examples of the solvents include (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; lactic acid alkyl esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-amyl formate, i-amyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate and ethyl 2-hydroxybutanoate; aromatic hydrocarbons such as toluene and xylene; and amides such as N-methylpyrrolidone, N,N-dimethylformamide and N,N-dimethylacetamide.

Out of these solvents, propylene glycol monomethyl ether, ethylene glycol monomethyl ether acetate, propylene glycol monomethyl ether acetate, propylene glycol monoethyl ether acetate, diethylene glycol dimethyl ether, diethylene glycol methyl ethyl ether, cyclohexanone, 2-heptanone, 3-heptanone, ethyl 2-hydroxypropionate, ethyl 3-methoxypropionate, methyl 2-ethoxypropionate, ethyl 3-ethoxypropionate, 3-methyl-3-methoxybutyl propionate, n-butyl acetate, i-butyl acetate, n-amyl formate, i-amyl acetate, n-butyl propionate, ethyl butyrate, i-propyl butyrate, ethyl pyruvate and n-butyl butyrat are preferred from the viewpoints of solubility, pigment dispersibility and coatability.

The above solvents may be used alone or in combination of two or more.

The solvents may be used in conjunction with a high-boiling point solvents such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or ethylene glycol monophenyl ether acetate.

Out of these high boiling point solvents, γ-butyrolactone is preferred.

The above high boiling point solvents may be used alone or in combination of two or more. The total amount of solvent used is not critical, but from the perspective of the coating and the safety of photosensitive composition, the solvent composition of the present invention is from 5 to 90% by weight of the overall composition, preferably 20 to 80%.

Chemical Additives

The chemical additives of the present invention are not critical, depending on the application of the photoresist today, a predetermined amount of sensitizers, dissolution inhibitors, surfactants, dyes, antioxidant and other high polymers can be selectively added, thereby achieving a photoresistor with the required criteria and standards. These individual chemical additives are usually less than 1% by weight of the ratio of the whole photoresistor compositions.

Preparation of the Photoresist Composition

The photoresist composition of the present invention may be obtained by mixing the aforesaid components. The aforementioned (a) base-soluble resins can be first dissolved in (f) solvents, and further mix with other components. Alternatively, all components other than (a) base-soluble resins can be mixed first, dissolved in (f) solvents, then (a) base-soluble resin is mixed after.

Formation of the Photoresist Light Diffuse Reflecting Film

Spin-coating, spray-coating, screen printing, and roller-coating, are the suitable coating techniques that can be applied to coat the photoresist composition on the substrate. Once the substrate is coated on, normally a hot plate is set below to heat the coated substrate, which the solvent is removed. The preheating condition varies on the types and ratio of the compositions, preferably at 50~90° C. for 1-15 minutes. The coated thickness of photoresist composition is such that the dried up photoresist composition is 0.1~10 μm thick, preferably 0.2~5 μm, more preferably 0.2~4 μm.

Afterwards, the coated and preheated substrate is placed under the desirous photo mask design and exposed under light ray to develop the desired pattern on the substrate material. The coated substrate can be exposed under visible light, ultraviolet light, and deep ultraviolet light, while wavelengths in the range of 190~450 nm are preferable. The energy of the light source usually ranges from 5~200 mJ/cm$^2$, however, even if the energy is reduced to 10~100 mJ/cm$^2$ the photosensitive compositions can still be hardened. Follow up a developer solution is utilized to remove any unnecessary parts so the designed pattern can be obtained.

A developer solution can be any alkali developer solution; the commonly used are ammonia, triethyl amine, dimethyl amine methyl alcohol, tetramethyl ammonium hydroxide, sodium hydroxide, potassium hydroxide, sodium carbonate, potassium carbonate or alkaline aqueous solutions such as trimethyl hydroxyethyl ammonium hydroxide. The aforementioned alkaline aqueous solution is added with a predetermined amount of methyl alcohol, ethyl alcohol and other organic solvents and/or aqueous surfactants. Development may be carried out by shower development, spray development, dip development or puddle development. The developing condition is preferably under ambient temperature for 5~300 seconds. After alkaline development, most likely water wash is preceded.

A compressed stream of air or nitrogen is applied for drying; thereby a pattern can be developed. The pattern is then heated by a hot plate, an oven, or other heating apparatus (generally referring as post-exposure hard bake) at a predetermined temperature such as 120~300° C. The time on a hot plate is between 5~30 minutes and 30~90 minutes inside an oven. At the meantime, the composition of the present invention is additionally added with thermosetting crosslinking reagents in the presence of heat, where afterwards both the chemical resistance and the mechanical strength of the pattern on the photoresist film are enhanced.

At this point, the formation of the pattern on every unit is preferably in a bumpy form. Observing from the top, the preferred patterns are either round arc or slightly round arc like, with a diameter of 0.1~30 μm, preferably 0.1~10 μm.

Next, with the use of metal evaporation, the reflective film of the light diffuse reflecting film of the present invention is obtained.

At this moment, the metal used for evaporation is not critical, but preferably a metal with high index of reflection in the visible light range as well as even thickness. From this perspective, alloys having at least aluminum or a silver component are preferred.

Moreover, the pattern of the aforesaid reflective film of the light diffuse reflecting film preferably takes the pattern before the metal evaporation.

More detailed examples are used to illustrate the present invention, and these examples are used to explain the present invention. The examples below, which are given simply by way of illustration, must not be taken to limit the scope of the invention.

PREPARATION EXAMPLE 1

(a) Synthesizing Base-Soluble Resin

To a reaction flask, 200 g of trimethylene glycol monomethyl ether acetate, 128.62 g of benzyl methacrylate, 9.39 g of methacrylic acid are added. To this reaction bottle, 0.69 g of AIBN initiator is further added and elevated to a temperature of 70° C., upon reaction completion purification follows; after dried 125 g of white powder of polymer of formula (I) is obtained, with an yield of approximately 37%. The product is sampled for GPC detection where the mean molecular weight is 30,000 g/mole, and glass transition temperature of 150° C.

EXAMPLE 1

Preparation of Photoresistor Composition 12.37 g of the (a) base-soluble resin of the formula (I) obtained accordingly to preparation example 1, (b) 8.24 g of polyfunctional monomer Aronix M-400 (product of Toagosei Co., Ltd.), (c) 3.09 g of photopolymerization initiator IRGACURE 907 (product of Ciba Specialty Chemicals) and 1.03 g of Chemcure-ITX (product of Chembridge International Corp), (d) 2.47 g of thermosetting cross-linking reagent Cymel 303 (product of Cytec Industries Inc.), (e) 0.8 g of ultraviolet absorber Eversorb 77 (product of Everlight Chemical Inc.), and (f) 72.0 g of solvent propylene glycol monomethyl ether acetate are all mixed thoroughly. To this solution, 2 μm of filter is used to filter the solution.

Formation of Photoresist Film of Light Diffuse Reflecting Film

The solution is coated on top of an alkali-free glass substrate, and then it is spin-coated for 20 seconds at 750 rpm. Finally, a uniform and thin film is formed.

Inside a clean oven setting at 90° C., the substrate is heated for 10 minutes to form a photoresist film of 2 μm in thickness.

Next, when the substrate is cooled to room temperature, a high pressure mercury vapor lamp is utilized. Through a line width of 4 μm photo mask, to the photoresist film, ultraviolet lights having wavelengths of 254 nm, 313 nm, 365 nm and 405 nm are exposed with an energy of 80 mJ/cm$^2$ on the photoresist film.

After, the substrate is immersed in 0.05 weight % of potassium hydroxide aqueous solution at 23° C. for 90 seconds, and followed with development, where then ultra pure water is washed with, then dried after.

The dried pattern is further proceeded with post-exposure hard bake in an oven at 220° C. for 30 minutes.

The hard baked photoresist film is then analyzed with Scanning Electron Microscope (SEM) for the microscopic structure of the shape. The results show that the bumpy surface has a 4 μm of resolution, the film thickness of the exposed region is 1.88 μm, and unexposed region film thickness is 0.887 μm (887.32 nm), and the aspect ratio is 1/4=0.25.

EXAMPLES 2~7

Preparation of Photoresistor Composition

Similar procedures as in example 1 are repeated with a minor change in (e) for the preparation of photoresistor composition, where ultraviolet absorbers of the present examples are listed in table 1, but the amount remains unchanged. The rest of experimental procedure is the same, and the results are showing as table 2:

TABLE 1

Types of Ultraviolet Absorber Additives

| Example | Product Name | Chemical Structure |
|---|---|---|
| | | Benzophenone Type |
| Example 2 | Eversorb 10 | 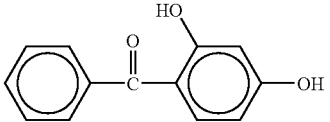 |
| Example 3 | Eversorb 12 | 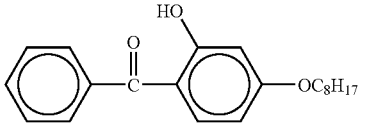 |
| | | Benzotriazole Type |
| Example 1 | Eversorb 77 | 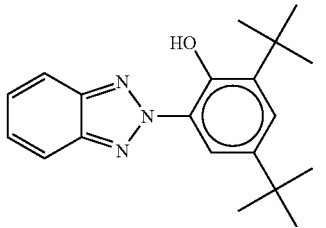 |
| Example 4 | Eversorb 74 | 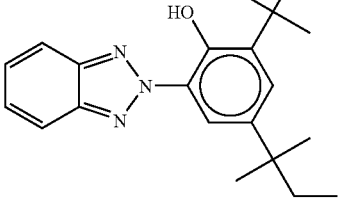 |

TABLE 1-continued

Types of Ultraviolet Absorber Additives

| Example | Product Name | Chemical Structure |
|---|---|---|
| Example 5 | Eversorb 76 | 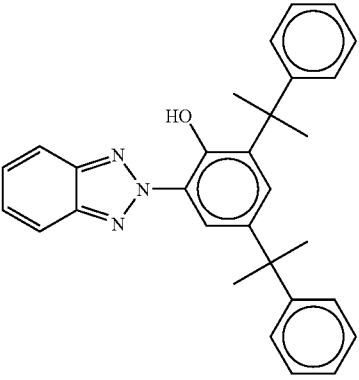 |
| Example 6 | Eversorb 79 | 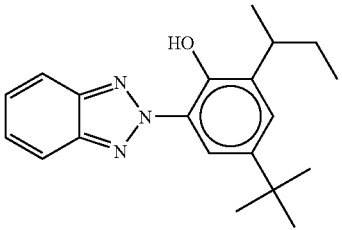 |

COMPARATIVE EXAMPLE 1

Method of Preparing a Photoresistor Composition (in Absence of Ultraviolet Absorber)

Similar procedures as in example 1 are repeated with slight modification in the absence of (e) ultraviolet absorber to prepare the photoresistor composition, and the rest experimental procedure remains the same. The results are listed in table.

TABLE 2

Aspect Ratio of Exposed and Unexposed Region of Photoresist

| Example | Ultraviolet Absorber | Film Thickness of Exposed Region (μm) | Film Thickness of Unexposed Region (μm) | Depth (μm) | Thickness (μm) | Aspect Ratio |
|---|---|---|---|---|---|---|
| 1 | Eversorb 77 | 1.88 | 0.89 | 0.99 | 4 | 0.25 |
| 2 | Eversorb 10 | 2.03 | 1.42 | 0.61 | 4 | 0.15 |
| 3 | Eversorb 12 | 2.13 | 1.54 | 0.59 | 4 | 0.15 |
| 4 | Eversorb 74 | 1.42 | 0.76 | 0.66 | 4 | 0.16 |
| 5 | Eversorb 76 | 2.35 | 1.75 | 0.60 | 4 | 0.15 |
| 6 | Eversorb 79 | 1.75 | 1.06 | 0.69 | 4 | 0.17 |
| Comparative Example 1 | none | 1.88 | 1.48 | 0.40 | 4 | 0.10 |

As the result shown in table 2, the addition of a predetermined amount of ultraviolet absorber of the present invention can effectively control the sensitivity of photoresist, under high resolution (4 μm), a suitable aspect ratio of curved lithographic pattern can be achieved.

EXAMPLE 8

Testing of Physical Property and Chemical Resistance of the Photoresist Film

Photoresist substrate of example 1 is selected for the physical property and the chemical resistance test.

(I) Adhesion Testing

A fraction of the photoresist substrate formed according to example 1 is obtained. Referring to the method of 8.5.2 adhesion testing of JIS K-5400 (1900) 8.5, a dissecting knife is employed to divide the aforesaid photoresist substrate into 100 checker boxes to proceed with adhesion testing. At this moment, the number of residual checker boxes are 100 (they are not separate), which demonstrates that the photoresist film of the photoresist composition of the present invention has superior adhesion.

(II) Water Resist Adhesion Testing

A fraction of the photoresist substrate formed according to example 1 is obtained, immersed at a temperature of 80° C. for 60 minutes and dried after. Referring to the method of 8.5.2 adhesion testing of JIS K-5400 (1900) 8.5, a dissecting knife is employed to divide the aforesaid photoresist substrate into 100 checker boxes to proceed with adhesion testing. At this moment, the number of residual checker boxes are 100 (they are not separated), which demonstrates that the photoresist film of the photoresistor composition of the present invention has superior water resist adhesion.

(III) Solvent Resistance Testing

A fraction of the photoresist substrate formed according to example 1 is obtained. Firstly the photoresist film thickness is determined, then the substrate is immersed at a temperature of 20° C. (as table 3 below) for 30 minutes, thereafter it is dried and film thickness is again measured. The change in thickness of the photoresist film is tabulated and the results are showed in table 3, where photoresist film of the present invention has a superior solvent resistance property.

TABLE 3

| | Solvent Resistance Test | | |
|---|---|---|---|
| Solvent | Photoresist Film Thickness (μm) Before Soaked in Solvent | Photoresist Film Thickness (μm) After Soaked in Solvent | Change in Film Thickness |
| 5% NaOH | 1.46 | 1.46 | 0.00% |
| 5% HCl | 1.47 | 1.49 | 1.15% |
| N-Methyl-2-Pyrrolidone (NMP) | 1.40 | 1.39 | −0.21% |
| Isopropyl Alcohol (IPA) | 1.48 | 1.49 | 0.47% |

Although the present invention has been explained in relation to its preferred embodiments, it is to be understood that many other possible modifications and variations can be made without departing from the scope of the invention as hereinafter claimed.

What is claimed is:

1. A negative photoresist composition for light diffuse reflecting film of the display panel comprising:
   (a) 8 to 90% by weight of an alkali-soluble resin;
   (b) 1 to 30% by weight of a polyfunctional monomer;
   (c) 0.1 to 20% by weight of a photopolymerization initiator;
   (d) 0.1 to 20% by weight of a thermosetting cross-linking reagent;
   (e) 0.01 to 10% by weight of an ultraviolet absorber; and
   (f) 8 to 90% by weight of a solvent
   wherein said (f) solvent is selecting from the group consisting of ethylene glycol monomethyl ether acetate, propylene glycol monomethyl ether, propylene glycol monomethyl ether acetate, propylene glycol monoethyl ether acetate, diethylene glycol dimethyl ether, diethylene glycol methyl ethyl ether, cyclohexanone, 2-heptanone, 3-heptanone, ethyl 2-hydroxypropionate, ethyl 3-methoxypropionate, methyl 2-ethoxypropionate, ethyl 3-ethoxypropionate, 3-methyl-3-methoxybutyl propionate, n-butyl acetate, i-butyl acetate, n-amyl formate, i-amyl acetate, n-butyl propionate, ethyl butyrate, i-propyl butyrate, n-butyl butyrate and ethyl pyruvate.

2. The photoresist composition of claim 1, wherein said (a) alkali-soluble resin is a copolymer of an ethylenically unsaturated monomer having at least one carboxyl group and another copolymerizable ethylenically unsaturated monomer.

3. The photoresist composition of claim 1, wherein said (a) alkali-soluble resin is an ethylenically unsaturated monomer having at least one carboxyl group, and the copolymerization ratio of the ethylenically unsaturated monomer having carboxyl group is between 5 to 50%.

4. The photoresist composition of claim 1, wherein said (b) polyfunctional monomer is selected from the group consisting of polyacrylates and polymethacrylates of polyhydric alcohols having 3 or more hydroxyl groups and dicarboxylic acid modified products thereof.

5. The photoresist composition of claim 1, wherein said (b) polyfunctional monomer is selected from the group consisting of trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

6. The photoresist composition of claim 1, wherein said c) photopolymerization initiator sensitive to wavelength in the range of 190 to 450 nm enables (b) polyfunctional monomer to proceed with polymerization reaction.

7. The photoresist composition of claim 6, wherein said c) photopolymerization initiator is a compound with one of a morpholino ring, a thioxanthone ring or an imidazole ring.

8. The photoresist composition of claim 1, wherein said (d) thermosetting crosslinking reagent is selected from the group consisting of hexamethylmelamine, hexabutylmelamine, partially methylized melamine, and the alkylated products thereof.

9. The photoresist composition of claim 1, wherein said (e) ultraviolet absorber is selected from the group consisting of benzotriazole ultraviolet absorbers and benzophenone ultraviolet absorbers.

10. The photoresist composition of claim 1, wherein said ultraviolet absorber is of the following formula:

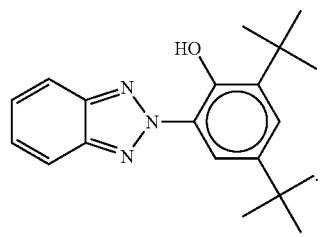

11. The photoresist composition of claim 1, wherein said (e) ultraviolet absorber is in the range from 0.1 to 5% by weight.

* * * * *